US008687377B2

(12) United States Patent
Harashima et al.

(10) Patent No.: US 8,687,377 B2
(45) Date of Patent: Apr. 1, 2014

(54) STORAGE DEVICE, ELECTRONIC DEVICE, AND CIRCUIT BOARD ASSEMBLY

(75) Inventors: Masaru Harashima, Tokyo (JP); Norihiro Ishii, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 198 days.

(21) Appl. No.: 13/308,432

(22) Filed: Nov. 30, 2011

(65) Prior Publication Data
US 2012/0250279 A1    Oct. 4, 2012

(30) Foreign Application Priority Data

Mar. 31, 2011 (JP) .................. 2011-080674

(51) Int. Cl.
*H05K 5/00* (2006.01)
(52) U.S. Cl.
USPC ........... 361/756; 361/736; 361/741; 361/748; 361/752
(58) Field of Classification Search
USPC .......... 361/736, 741, 747, 748, 752, 756, 759
See application file for complete search history.

(56) References Cited

FOREIGN PATENT DOCUMENTS

| JP | H05-41169 | 6/1993 |
|----|-----------|--------|
| JP | H06-86376 | 12/1994 |
| JP | 08-271863 | 10/1996 |
| JP | 2001-160660 | 6/2001 |
| JP | 2003-347685 | 12/2003 |
| JP | 2005-019689 | 1/2005 |
| JP | 2005-235997 | 9/2005 |
| JP | 2009-289278 | 12/2009 |
| JP | 2010-056489 | 3/2010 |

OTHER PUBLICATIONS

Japanese Patent Application No. 2011-080674, Notice of Rejection, mailed Apr. 3, 2012, (with English Translation).

*Primary Examiner* — Ramon Barrera
(74) *Attorney, Agent, or Firm* — Blakely, Sokoloff, Taylor & Zafman LLP

(57) ABSTRACT

According to one embodiment, a storage device includes a housing, a circuit board, and a module. The circuit board is located in the housing, and includes a first surface and a second surface located opposite the first surface. The module is provided on at least one of the first surface and the second surface of the circuit board. The circuit board is provided with a first notch and a connection portion to be connected to the housing at the periphery. The first notch is provided with a second notch extending toward an area between the connection portion and a module fixation area where the module is fixed on the circuit board.

5 Claims, 6 Drawing Sheets

STORAGE DEVICE, ELECTRONIC DEVICE, AND CIRCUIT BOARD ASSEMBLY

CROSS-REFERENCE TO RELATED APPLICATIONS

This application is based upon and claims the benefit of priority from Japanese Patent Application No. 2011-080674, filed Mar. 31, 2011, the entire contents of which are incorporated herein by reference.

FIELD

Embodiments described herein relate generally to a storage device, an electronic device, and a circuit board assembly.

BACKGROUND

There have been known electronic devices having a housing that houses a circuit board provided with a module such as a nonvolatile semiconductor memory.

In this type of electronic devices, if the circuit board is warped when connected to the housing, the connection strength between the circuit board and the module may be locally reduced.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate first embodiments of the invention and not to limit the scope of the invention.

DETAILED DESCRIPTION

Figure 1:
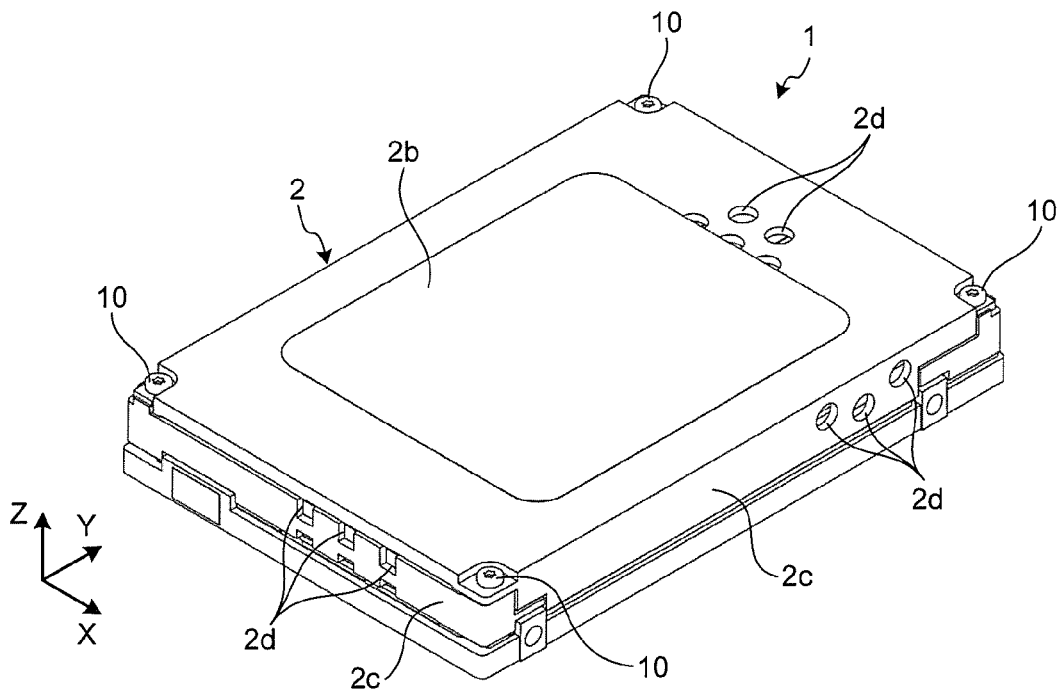
FIG. 1 is an exemplary perspective view of a storage device according to a first embodiment.

In general, according to one embodiment, a storage device comprises a housing, a circuit board, and a module. The circuit board is located in the housing, and comprises a first surface and a second surface located opposite the first surface. The module is provided on at least one of the first surface and the second surface of the circuit board. The circuit board is provided with a first notch and a connection portion to be connected to the housing at the periphery. The first notch is provided with a second notch extending toward an area between the connection portion and a module fixation area where the module is fixed on the circuit board.

Exemplary embodiments will be described in detail below with reference to the accompanying drawings. In the following embodiments, like elements are designated by like reference numerals, and their description will not be repeated.

FIG. 1 illustrates a semiconductor storage device 1 as an example of a storage device and an electronic device according to a first embodiment. For the sake of convenience, directions are defined as follows: X direction indicates the sort-side direction of the rectangular top or bottom surface of the semiconductor storage device 1; Y direction indicates the long-side direction; and Z direction indicates the width direction.

Figure 2:
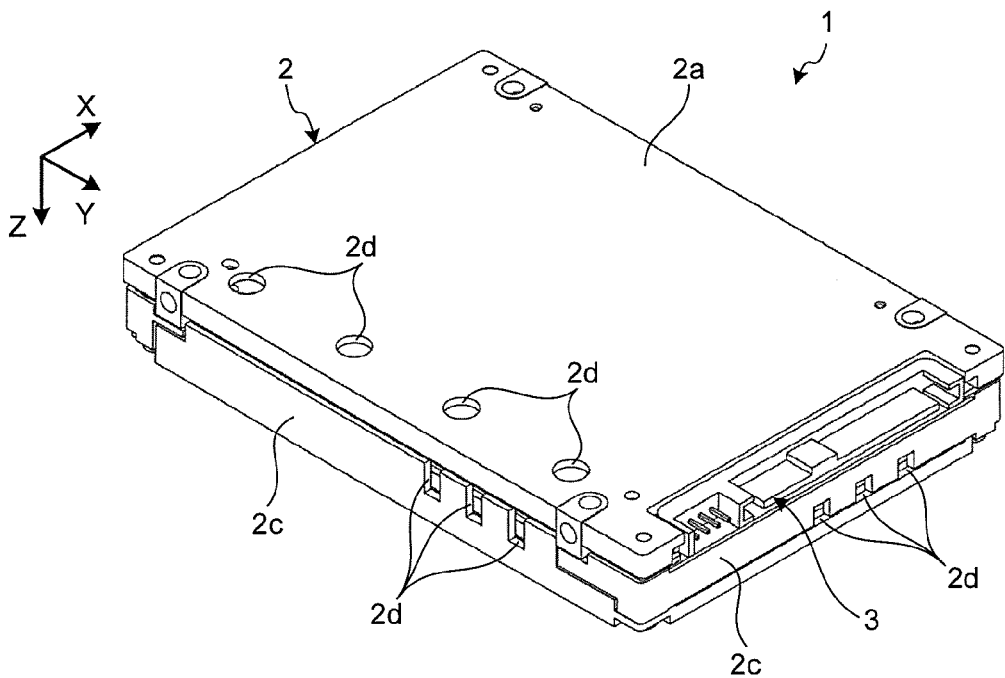
FIG. 2 is an exemplary perspective view of the storage device viewed from a different angle in the first embodiment.

The semiconductor storage device 1 is a solid-state drive (SSD), and is installed in an electronic device (not illustrated) such as a personal computer (PC), a server, a storage box, or the like, or housed in the housing (not illustrated) of them. As illustrated in FIGS. 1 and 2, the semiconductor storage device 1 has a flat rectangular parallelepiped appearance and is rectangular in a plan view (i.e., in a view from the Z direction). The semiconductor storage device 1 comprises a housing 2 having a bottom wall 2a (first wall), a top wall 2b (second wall), and a side wall 2c (third wall). The bottom wall 2a, the top wall 2b, and the side wall 2c are examples of an outer wall or a wall. As illustrated in FIG. 2, part of the housing 2 (in the first embodiment, part of the side wall 2c and the bottom wall 2a) is cut out to expose a connector 3 for external connection.

Figure 3:
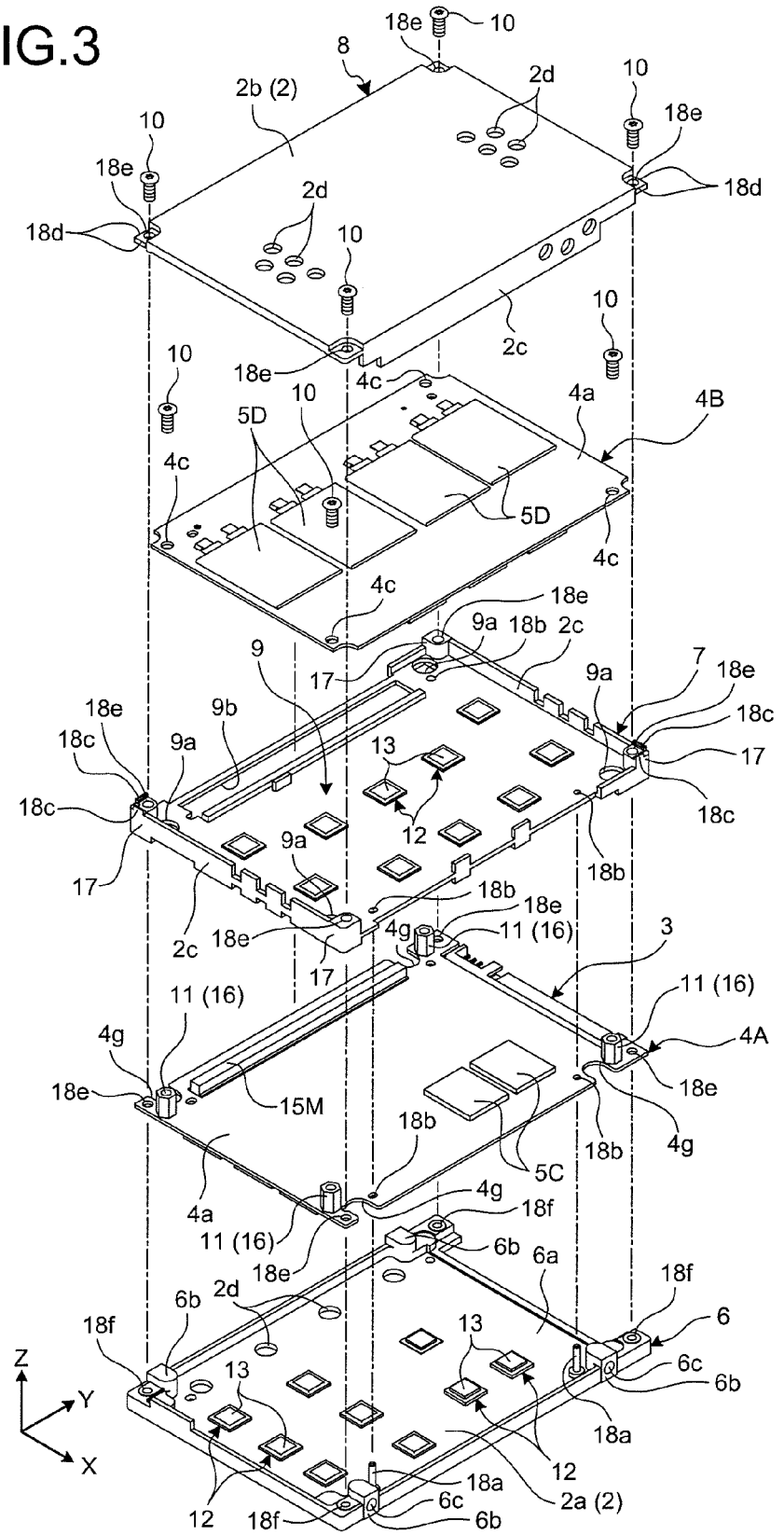
FIG. 3 is an exemplary exploded perspective view of the storage device in the first embodiment.
Figure 4:
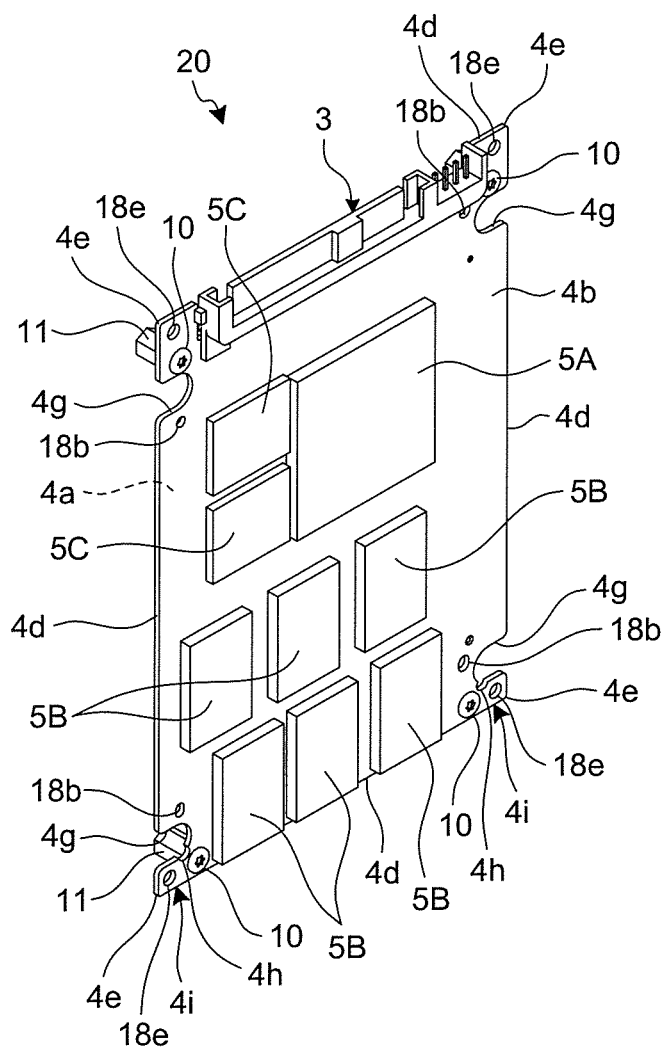
FIG. 4 is an exemplary perspective view of a first board of the storage device in the first embodiment.

As illustrated in FIG. 3, the housing 2 houses therein a plurality of (in the first embodiment, two) circuit boards (printed circuit boards, printed wiring boards, wiring substrates, rigid flexible printed wiring boards, etc.), i.e., a first board 4A and a second board 4B, in layers with a space between them. As illustrated in FIGS. 3 and 4, the first board 4A and the second board 4B are each provided with a plurality of semiconductor devices (modules, electronic components, components). In the first embodiment, the semiconductor devices include a System-on-a-Chip (SoC) device 5A, a NAND flash memory 5B, a double data rate random access memory (DDR RAM) 5C, a capacitor 5D, and the like. The SoC 5A is a chip formed of an integration of a central processing unit (CPU), a controller, and the like. The SoC 5A controls data read/write access to the NAND 5B and the DDR RAM 5C. The SoC 5A also controls data exchange with, for example, a host controller of an electronic device to which the semiconductor storage device 1 is connected via the connector 3 according to a serial advanced technology attachment (SATA) standard or the like. The NAND 5B is a nonvolatile semiconductor memory. The capacitor 5D supplements power supply from the electronic device. The semiconductor devices are heat generating elements that generate heat. In the first embodiment, the SoC 5A generates the largest amount of heat.

The first board 4A and the second board 4B are, for example, printed circuit boards (PCBs). The semiconductor devices (the SoC 5A, the NAND 5B, the DDR RAM 5C, the capacitor 5D) are mounted on at least one of (in the first embodiment, both) an upper surface 4a (first surface) and a lower surface 4b (second surface) of the first board 4A and the second board 4B by, for example, surface mounting. It is to be noted that the terms "upper" and "lower" are used merely as a matter of convenience, and are not intended to limit the orientation of the first board 4A and the second board 4B.

As illustrated in FIG. 3, in the first embodiment, the semiconductor storage device 1 comprises a base 6, the first board 4A, an intermediate member 7, the second board 4B, and a cover 8. In the first embodiment, for example, the base 6 mainly constitutes the bottom wall 2a of the housing 2, while the cover 8 mainly constitutes the top wall 2b and the side wall 2c. The intermediate member 7 mainly constitutes part of the side wall 2c and a partition wall 9 located between the first board 4A and the second board 4B. In the first embodiment, the base 6, the first board 4A, the intermediate member 7, the second board 4B, and the cover 8 are integrated by fixing components (assembly components, fasteners, see FIGS. 1 and 3) such as screws 10 and studs 11. The base 6, the intermediate member 7, and the cover 8 are examples of the housing 2 and parts (constituent elements, divisional bodies) that constitute the housing 2. The first board 4A, the intermediate member 7, and the cover 8 are provided with through holes 18e as an example of through portions that allows the screws 10 to pass through to integrally fix (connect) the base 6, the first board 4A, the intermediate member 7, and the cover 8. In the first embodiment, for example, the screws 10 are respectively inserted into the through holes 18e from the cover 8 and fastened to female screw holes 18f provided to the base 6 as an example of coupling portions.

As illustrated in FIG. 3, in the first embodiment, on an upper surface 6a of the base 6, there is provided a plurality of pins 18a that protrude toward the cover 8. The first board 4A and the intermediate member 7 are provided with through holes 18b that allow the pins 18a to pass through. In the first embodiment, the pins 18a and the through holes 18b position the base 6, the first board 4A, and the intermediate member 7 in the X and Y directions. The through holes 18b are an example of through portions. At opposite corners of the intermediate member 7, there are provided ribs 18c that protrude toward the cover 8. The cover 8 is provided with notches 18d that engage with the ribs 18c, respectively. In the first embodiment, the ribs 18c and the notches 18d position the intermediate member 7 and the cover 8 in the X and Y directions.

In the first embodiment, the base 6, the intermediate member 7, and the cover 8, which constitute the housing 2 (and the partition wall 9), are made of a material having relatively high thermal conductivity such as a metal material of copper alloy, stainless steel, aluminum alloy, or the like. With this, heat generated by the semiconductor devices (the SoC 5A, the NAND 5B, the DDR RAM 5C, the capacitor 5D) as heat generating elements can be dissipated outside the semiconductor storage device 1 through the housing 2 and the partition wall 9. Thus, the temperature rise in the housing 2 can be reduced.

It is preferable to form a coating (not illustrated) having high heat radiation performance on the surfaces of the base 6, the intermediate member 7, and the cover 8 that constitute the housing 2 (and the partition wall 9). More specifically, for example, such a coating can be formed by the application of paint that contains a filler having excellent heat radiation performance (e.g., ceramic particles, etc. for insulating, and metal particles, carbon fiber, etc. for non-insulating). With this, heat generated by the semiconductor devices as heat generating elements can be more easily dissipated to the outside of the semiconductor storage device 1 through the coating. Thus, the temperature rise in the housing 2 can be further reduced. The coating may also be formed by attaching a sheet having high heat radiation performance or the like.

Further, as illustrated in FIGS. 1 to 3, it is preferable to form ventilation holes 2d in the base 6, the intermediate member 7, the cover 8, and the like that constitute the housing 2 to let air in and out of the housing 2. With this, heat generated by the semiconductor devices as heat generating elements can be dissipated outside the semiconductor storage device 1 by air circulation through the ventilation holes 2d. Thus, the temperature rise in the housing 2 can be further reduced. The ventilation holes 2d are preferably located at positions facing or near semiconductor devices that generate a large amount of heat (e.g., the SoC 5A, etc.). There may be provided a convex and concave portion such as fins on the outer surface of the housing 2 to further improve the heat radiation performance.

As illustrated in FIG. 4, the semiconductor devices such as the SoC 5A, the NAND 5B, the DDR RAM 5C, and the like are mounted on the lower surface 4b of the first board 4A. As illustrated in FIG. 3, on the upper surface 6a of the base 6 that faces the lower surface 4b of the first board 4A, there are provided protrusions 12 each facing the center of each semiconductor device (5A, 5B, 5C). The protrusions 12 are formed in a relatively short rectangular column-like shape. The protrusions 12 have a flat top surface parallel to the upper surface 6a. The height of the protrusions 12 is set not to interfere with each semiconductor device (5A, 5B, 5C). With this, in the first embodiment, each of the protrusions 12 can be located near corresponding one of the semiconductor devices (5A, 5B, 5C). Accordingly, heat generated by the semiconductor devices (5A, 5B, 5C) as heat generating elements can be more easily dissipated to the outside of the semiconductor storage device 1 through the protrusions 12 and the base 6. Thus, the temperature rise in the housing 2 can be further reduced.

As illustrated in FIG. 3, in the first embodiment, there are provided interposed members 13 on the top surfaces of the protrusions 12. For example, the interposed members 13 are interposed between the semiconductor devices (5A, 5B, 5C) and the protrusions 12, respectively. The interposed members 13 are each formed in a flat rectangular sheet having flexibility, elasticity, or resilience and are attached to the top surfaces by, for example, adhesion. The interposed members 13 are made of a material having relatively high thermal conductivity (acrylic resin, fluororesin, polyamide resin, etc.). With this, heat generated by the semiconductor devices (5A, 5B, 5C) as heat generating elements can be more easily dissipated to the outside of the semiconductor storage device 1 through the interposed members 13, the protrusions 12, and the base 6. Thus, the temperature rise in the housing 2 can be further reduced. The protrusions 12 and the interposed members 13 may also be provided to the intermediate member 7 (the partition wall 9) and the cover 8.

As illustrated in FIG. 3, the studs 11 are attached as board connectors 16 to the upper surface 4a of the first board 4A. In the partition wall 9 of the intermediate member 7, there are provided through holes 9a to allow the studs 11 to pass through. In the second board 4B, there are provided through holes 4c corresponding to the studs 11 passing through the through holes 9a to allow the screws 10 to pass through. The screws 10 passing through the through holes 4c from the upper surface 4a of the second board 4B are fastened (connected) to the studs 11, and thereby the first board 4A and the second board 4B are joined (connected) together. Further, an elongated rectangular through hole 19b is formed in the partition wall 9 to allow a connector 15M on the first board 4A and a connector (not illustrated) on the second board 4B to pass through. A predetermined clearance is set between the through holes 9a, 9b and the corresponding studs 11 and the connector 15M so that the partition wall 9 (the intermediate member 7) is not to come in contact with the studs 11 and the connector 15M. Since the clearance makes spaces in front and back of the partition wall 9 communicate with each other, heat rejection effect can be achieved by air circulation (convection).

Figure 5:
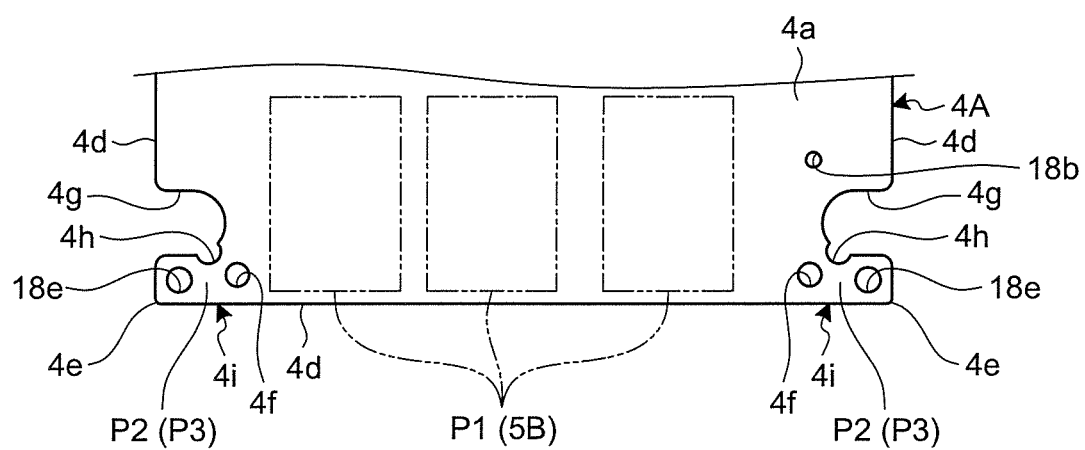
FIG. 5 is an exemplary plan view of part of the first board of the storage device in the first embodiment.

FIG. 4 is a perspective view of an example of a circuit board assembly 20 formed of the first board 4A provided with the semiconductor devices 5A to 5C, and the like. FIG. 5 is a plan view of an example of part of the first board 4A. As illustrated in FIG. 4, the first board 4A is formed in a rectangular shape and comprises four edges 4d (sides) and four corners 4e. At the periphery of the first board 4A (in the first embodiment, for example, the four corners 4e), there are provided through portions (in the first embodiment, for example, the through holes 18*e*) as an example of connecting portions to the housing 2. The screws 10 (see FIG. 3) as an example of fasteners passing through the through portions are fastened to the coupling portions of the housing 2 (in the first embodiment, for example, the female screw holes 18*f*, see FIG. 3), and thereby the first board 4A is connected (fixed) to the housing 2. The through holes 18*e* are an example of connection portions to be connected to the housing 2.

First notches 4*g* are formed in the periphery of the first board 4A (in the first embodiment, for example, positions in the edges 4*d* near the four corners 4*e*). The first notches 4*g* are provided to avoid interference with coupling portions 6*b* (see FIG. 3) on the base 6 as the housing 2. The coupling portions 6*b* are each provided with a female screw hole 6*c* having an opening on the side (outside the periphery, side in, for example, the X direction). The female screw hole 6*c* is an example of a connecting portion. With a screw (not illustrated) fastened to the female screw hole 6*c*, the semiconductor storage device 1 is fixed to an electronic device (not illustrated).

As illustrated in FIG. 5, the first notches 4*g* extend from an opposite pair of the edges 4*d* in the direction toward each other. The first notches 4*g* are each formed of a belt-like portion having a constant width near the edges 4*d* and an arched (crescentic) portion separated from the edges 4*d*. The first notches 4*g* provide arms 4*i* to the first board 4A. The arms 4*i* have the through holes 18*e*, respectively, as housing connection portions. In the first embodiment, with the first notches 4*g* (and the arms 4*i*) provided to the first board 4A, for example, an area P2 between the through holes 18*e* as housing connection portions and a module fixation area P1 where the NAND 5B as a semiconductor device (module) is fixed can be made relatively narrow. Accordingly, compared to the case without the first notches 4*g*, the area P2 is more flexible (deformable, bendable). If, for example, the first board 4A is inflexible upon being connected to the housing 2 through the through holes 18*e* as housing connection portions, when the first board 4A is fixed (connected) to the housing 2, the module fixation area P1 of the first board 4A is warped due to the size differences (production fluctuations) and the like between the first board 4A and the base 6 as the housing 2. As a result of the warp, the connection strength may decrease between the first board 4A and the NAND 5B. Regarding this, according to the first embodiment, the area P2 of the first board 4A is easily bent because of the first notches 4*g* and the arms 4*i*, which makes the module fixation area P1 less likely to be warped. Thus, for example, it is possible to suppress a decrease in the connection strength of the NAND 5B associated with the deformation of the first board 4A. The above structure is also effective for the case where the first board 4A is warped due to other factors, such as the case where the first board 4A is warped upon being heated due to the difference in linear expansion coefficient between the first board 4A and the housing 2.

According to the first embodiment, as illustrated in FIG. 5, the first board 4A is provided with a second notch 4*h* that extends from the periphery of each of the first notches 4*g* toward the area P2 between one of the through holes 18*e* as housing connection portions and the module fixation area P1 where the NAND 5B as a semiconductor device (module) is fixed. This further narrows the area P2, thereby forming a narrow area P3. As a result, the area P2 of the first board 4A is more easily bent, which further makes the module fixation area P1 less likely to be warped. Thus, for example, it is possible to suppress a decrease in the connection strength of the NAND 5B associated with the deformation of the first board 4A.

According to the first embodiment, the through holes 18*b* as through portions, into which are inserted the pins 18*a* (see FIG. 3) provided to the base 6 as the housing 2, are located opposite the second notch 4*h* with respect to each of the first notches 4*g*. Accordingly, the through holes 18*b* used for positioning are located separate from the areas P2 and P3 where the first board 4A is likely to be warped. Thus, for example, it is possible to suppress a decrease in positioning accuracy due to the deformation of the first board 4A.

Figure 6:
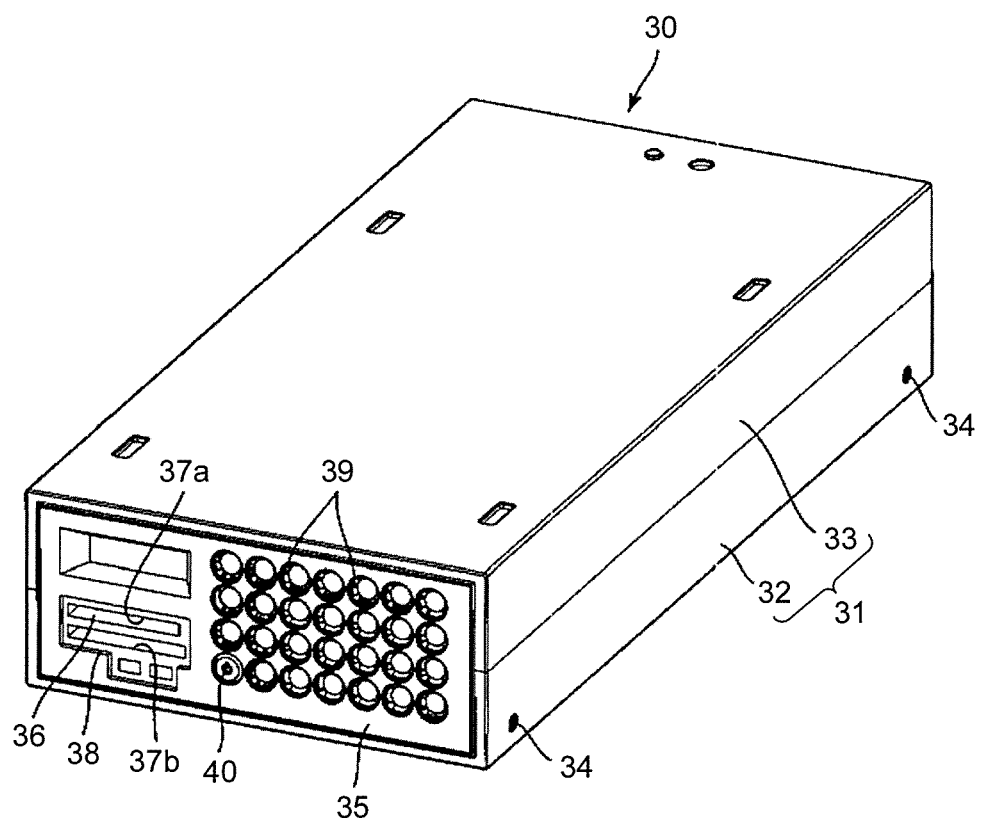
FIG. 6 is an exemplary perspective view of an electronic device according to a second embodiment.

FIG. 6 illustrates an electronic device 30 according to a second embodiment. As illustrated in FIG. 6, the electronic device 30 is, for example, a box-shaped server. The electronic device 30 comprises a rectangular parallelepiped housing 31. The housing 31 includes a first divisional body 32 (first portion, first component) and a second divisional body 33 (second portion, second component). There is provided a plate-like or frame-like framework structure (not illustrated) inside the housing 31, and the first divisional body 32 is fixed to the framework structure by screws 34 or the like. The second divisional body 33 is removably attached to the first divisional body 32. The user (operator) can remove the second divisional body 33 from the first divisional body 32 to expose the inside of the housing 31 and attach/detach the semiconductor storage device 1 to/from the framework structure or the like. The housing 31 can house therein a plurality of the semiconductor storage devices 1.

The electronic device 30 comprises a plate 35 on one side in the longitudinal direction. The electronic device 30 further comprises a card holder 36 including card slots 37*a* and 37*b*. Formed in the plate 35 are slits 38 corresponding to the card slots 37*a* and 37*b* and openings 39 functioning as ventilation holes. Besides, the electronic device 30 is provided with a lock mechanism 40 corresponding to one of the openings 39.

A plurality of the semiconductor storage devices 1 each having the housing 2 exemplified in the first embodiment can be installed in the electronic device 30. The inner structures of the semiconductor storage device 1 except the housing 2 (i.e., the first board 4A, the second board 4B, the partition wall 9, etc.) may be housed in the housing 31 of the electronic device 30. In this case, the housing 31 of the electronic device 30 serves also as the housing of the semiconductor storage device 1.

Figure 7:
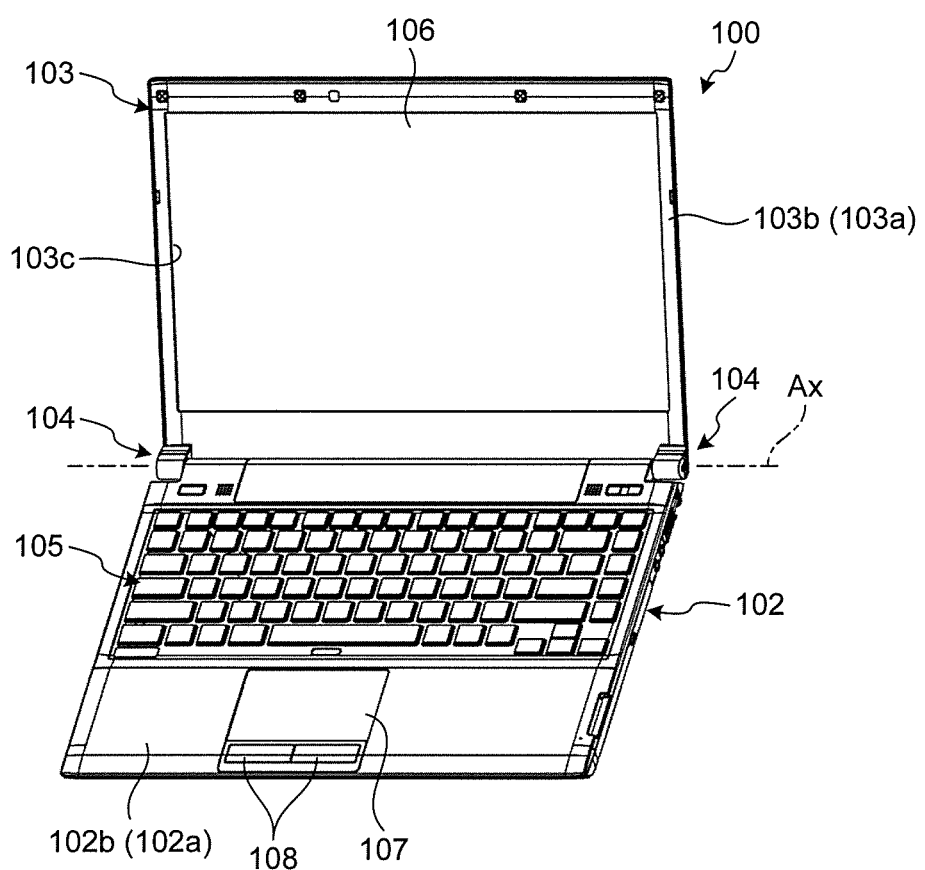
FIG. 7 is an exemplary perspective view of an electronic device according to a third embodiment.

FIG. 7 illustrates an electronic device 100 according to a third embodiment. As illustrated in FIG. 7, the electronic device 100 is, for example, a notebook personal computer (PC). The electronic device 100 comprises a flat rectangular first body 102 and a flat rectangular second body 103. The first body 102 and the second body 103 are connected by a hinge mechanism 104 to be relatively rotatable about a rotation axis Ax between an open position illustrated in FIG. 7 and a closed position (not illustrated).

The first body 102 is provided with a keyboard 105, a pointing device 107, click buttons 108, and the like as input devices, which are exposed on a front surface 102*b* (top surface, first surface) as the outer surface of a housing 102*a* of the first body 102. The second body 103 is provided with a display panel 106 (display device, display module, module) such as liquid crystal display (LCD). The display panel 106 is exposed from an opening 103*c* in a front surface 103*b* as the outer surface of a housing 103*a* of the second body 103. In the open position as illustrated in FIG. 7, the keyboard 105, the display panel 106, and the like are exposed so that the user can use them. On the other hand, in the closed position (not illustrated), the front surface 102*b* closely faces the front surface 103b, and the keyboard 105, the display panel 106, the pointing device 107, the click buttons 108, and the like are hidden between the housings 102a and 103a.

In the third embodiment, the semiconductor storage device 1 exemplified in the first embodiment is installed in the housing 102a of the first body 102. More specifically, for example, the housing 102a is provided with a recess (not illustrated) in the back surface (not illustrated) to house the semiconductor storage device 1. In this case, the first body 102 is provided with a connector (not illustrated) corresponding to the connector 3 of the semiconductor storage device 1 facing the recess, and the connector is connected to the connector 3 of the semiconductor storage device 1. Further, a cover (not illustrated) is attached to the back surface of the housing 102a to cover the recess that houses the semiconductor storage device 1.

Besides, the internal structures of the semiconductor storage device 1 except the housing 2 (i.e., the first board 4A, the second board 4B, the partition wall 9, etc.) may be housed in the housing 102a of the electronic device 100. In this case, the housing 102a of the electronic device 100 serves also as the housing of the semiconductor storage device 1. The semiconductor storage device 1 may be provided in the housing 103a of the second body 103. Further, a plurality of the semiconductor storage devices 1 may be provided in the housing 102a of the first body 102.

While the above embodiments are described by way of example as being applied to a semiconductor storage device comprising a circuit board, they may be applied to any other electronic devices. The specifications (structure, type, direction (up, down, left, right), shape, size, length, width, thickness, height, number, arrangement, position, material, etc.) can be suitably modified regarding the electronic device, the storage device, the semiconductor storage device, the circuit board, the module, the module fixation area, the area, the first notch, the second notch, the through portions, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
   a housing;
   a circuit board provided in the housing, the circuit board comprising a first surface and a second surface located opposite the first surface; and
   a module on at least one of the first surface and the second surface of the circuit board, wherein
   the circuit board is provided with a first notch and a connection portion to be connected to the housing at a periphery, and
   the first notch is provided with a second notch extending toward an area between the connection portion and a module fixation area where the module is fixed on the circuit board, wherein
   the circuit board is provided with a through portion at a position opposite the second notch with respect to the first notch to position the circuit board and the housing.

2. An electronic device comprising the storage device of claim 1.

3. An electronic device comprising:
   a housing;
   a circuit board provided in the housing, the circuit board comprising a first surface and a second surface located opposite the first surface; and
   a module on at least one of the first surface and the second surface of the circuit board, wherein
   the circuit board is provided with a first notch and a connection portion to be connected to the housing at a periphery, and
   the first notch is provided with a second notch extending toward an area between the connection portion and a module fixation area where the module is fixed on the circuit board, wherein
   the circuit board is provided with a through portion at a position opposite the second notch with respect to the first notch to position the circuit board and the housing.

4. A circuit board assembly comprising:
   a circuit board comprising a first surface and a second surface located opposite the first surface; and
   a module on at least one of the first surface and the second surface of the circuit board, wherein
   the circuit board is provided with a first notch and a through portion passing between the first surface and the second surface, and
   the first notch is provided with a second notch extending toward an area between the through portion and a module fixation area where the module is fixed on the circuit board, wherein
   the circuit board is provided with a through portion at a position opposite the second notch with respect to the first notch to position the circuit board and a housing.

5. The storage device of claim 1 wherein the circuit board includes a second through portion, the second through portion located opposite the through portion with respect to the first notch, wherein the second through portion suppresses a decrease in positioning accuracy of the circuit board due to deformation in the circuit board.

* * * * *